(12) United States Patent
Gazit et al.

(10) Patent No.: US 9,576,663 B1
(45) Date of Patent: Feb. 21, 2017

(54) MULTI-PORT MEMORY

(71) Applicant: Marvell International Ltd., Hamilton (BM)

(72) Inventors: Hillel Gazit, Palo Alto, CA (US); Sohail Syed, San Jose, CA (US); Gevorg Torjyan, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/170,184

(22) Filed: Jun. 1, 2016

Related U.S. Application Data

(60) Provisional application No. 62/172,863, filed on Jun. 9, 2015.

(51) Int. Cl.
  *G11C 8/00* (2006.01)
  *G11C 15/04* (2006.01)
(52) U.S. Cl.
  CPC ..................... *G11C 15/04* (2013.01)
(58) Field of Classification Search
  USPC  365/230.05, 230.03; 709/204–207; 711/141, 145
  See application file for complete search history.

(56) References Cited

U.S. PATENT DOCUMENTS

| | | | | |
|---|---|---|---|---|
| 6,557,078 B1 * | 4/2003 | Mulla | ................. | G06F 12/0855 711/119 |
| 8,266,233 B1 * | 9/2012 | Roka | ................. | H04M 1/72552 709/207 |
| 2004/0148472 A1 * | 7/2004 | Barroso | ............. | G06F 12/0817 711/141 |

* cited by examiner

*Primary Examiner* — Vu Le

(57) ABSTRACT

Multi-port memory circuitry includes single-port memory circuitry, and arbitration logic circuitry that accepts multiple memory queries for the single-port memory circuitry and prevents the multiple memory queries from addressing conflicting portions of the single-port memory circuitry within a single clock cycle. The arbitration logic circuitry may include conflict-resolution logic circuitry that determines whether multiple memory queries address conflicting portions of the single-port memory circuitry. The single-port memory circuitry may be divided into a plurality of sub-arrays, and the conflict-resolution logic circuitry determines whether the multiple memory queries address overlapping groups of sub-arrays. The single-port memory circuitry may be a content-addressable memory or a random-access memory. The multi-port memory circuitry may be part of a shared-memory, multi-processor apparatus. Each memory query may include a profile identifying at least one portion of the single-port memory circuitry targeted by the query, and the conflict-resolution logic circuitry would examine each profile.

21 Claims, 3 Drawing Sheets

MULTI-PORT MEMORY

CROSS REFERENCE TO RELATED APPLICATION

This claims the benefit of commonly-assigned U.S. Provisional Patent Application No. 62/172,863, filed Jun. 9, 2015, which is hereby incorporated by reference herein in its entirety.

FIELD OF USE

Implementations of the subject matter of this disclosure generally pertain to multi-port memory, and particularly to adaptation of single-port memory for multi-port use with minimal loss of bandwidth per port, without requiring additional capacity.

BACKGROUND

The background description provided herein is for the purpose of generally presenting the context of the disclosure. Work of the inventor hereof, to the extent the work is described in this background section, as well as aspects of the description that may not otherwise qualify as prior art at the time of filing, are neither expressly nor impliedly admitted to be prior art against the present disclosure.

A memory device may have a single port or two or more ports. A single-port memory device has one "port" through which requests for data can be received, and one corresponding port through which the requested data can be output in response to such requests. A multi-port memory device has more than one port through which requests for data can be received, and a corresponding number of ports through which the requested data can be output in response to such requests. For example, a dual-port memory has two read ports and two write ports.

In an ordinary memory device such as an SRAM memory device or a DRAM memory device, the requests would refer to the data being requested by its address in the memory device. In a content-addressable memory (CAM) device, each request could be structured as a search for particular memory content, rather than providing a particular address.

There may be systems where it is desirable to have memory requests directed to a memory device from more than one source device. For example, a memory device may be shared by multiple central processing units (CPUs) or, in a networking context, by multiple network processing units (NPUs).

One way to accomplish such a sharing arrangement is to use time division, in which each requesting source device has access to the memory device during specific clock cycles, usually distributed uniformly. Such a time-division sharing arrangement can reduce the access bandwidth to the memory device. For example, in a worst-case scenario, with k source devices sharing the memory device, a bandwidth BW can be reduced to BW/k per device.

Another way to accomplish such a sharing arrangement is to partition the memory device so that each port accesses its own segment of the memory device. However, in such an arrangement, for each port to be able to access any data in the memory device, the data have to be duplicated for each source device. Such an arrangement can increase the required memory capacity by a factor of k. That is, if each source device were to have access to the number of bits NB in the original memory device, the total required memory capacity or a shared device would be increased from NB to NBXk.

SUMMARY

Multi-port memory circuitry according to implementations of the subject matter of this disclosure includes single-port memory circuitry, and arbitration logic circuitry that accepts multiple memory queries for the single-port memory circuitry and prevents the multiple memory queries from addressing conflicting portions of the single-port memory circuitry within a single clock cycle.

The arbitration logic circuitry may include storage for holding ones of the multiple memory queries that address conflicting portions of the single-port memory circuitry. That storage may be a FIFO storage. Alternatively, that storage may be a random-access storage.

The arbitration logic circuitry may include conflict-resolution logic circuitry that determines whether multiple memory queries address conflicting portions of the single-port memory circuitry.

In the multi-port memory circuitry, the single-port memory circuitry may be divided into a plurality of sub-arrays, and the conflict-resolution logic circuitry determines whether the multiple memory queries address overlapping groups of sub-arrays.

In the multi-port memory circuitry, the single-port memory circuitry may be a content-addressable memory. Alternatively, the single-port memory circuitry may be a random-access memory.

A shared-memory, multi-processor apparatus according to implementations of the subject matter of this disclosure includes a plurality of processors, and multi-port memory circuitry. The multi-port memory circuitry includes single-port memory circuitry, and arbitration logic circuitry that accepts multiple memory queries for the single-port memory circuitry from the plurality of processors and prevents the multiple memory queries from addressing conflicting portions of the single-port memory circuitry within a single clock cycle.

A method, according to implementations of the subject matter of this disclosure, for operating arbitration logic circuitry to prevent the multiple memory queries from addressing conflicting portions of single-port memory circuitry within a single clock cycle, includes determining whether any of the multiple memory queries address conflicting portions of the single-port memory circuitry, and holding ones of the multiple memory queries that address conflicting portions of the single-port memory circuitry for at least one clock cycle until conflicts clear.

In such a method, each respective one of the multiple memory queries may include a respective profile identifying at least one portion of the single-port memory circuitry targeted by the respective one of the multiple memory queries, and determining whether any of the multiple memory queries address conflicting portions of the single-port memory circuitry includes examining each respective profile.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

According to implementations of the subject matter of this disclosure, a single-port memory device of a certain capacity, NB, and bandwidth, BW, can be shared by a number, k, of processors without having to increase the capacity of the memory device, and with minimal effect on bandwidth, by adding arbitration logic that accepts queries from the k processors, and determines if segments or tables in the single-port memory device that are targeted by the queries overlap or conflict. Queries that do not overlap or conflict are passed on to the single-port memory device for fulfillment in the same clock cycle. If there are queries that do overlap or conflict—i.e., that seek to access the same addresses, segments or tables in the single-port memory device—all but one of those queries are held in a queue in the arbitration logic and released in subsequent clock cycles as the conflicts clear (the one query that is not held is processed in the current clock cycle).

The queue in the arbitration logic can be stored in the arbitration logic in, for example, a FIFO storage. If a FIFO is used, queries would be released in the order in which they are queued up, even if the associated conflicts clear in a different order. In such a case, queries which are queued up later, but are subject to conflicts that clear earlier, might be held, even after the associated conflict has cleared, until conflicts for earlier-queued queries clear later. Therefore, in other implementations, the queue in the arbitration logic may be stored in a more randomly-addressable memory that allows queries to be released as soon as their associated conflicts are cleared, regardless of the state of conflicts associated with other queries that may have been queued up earlier.

The arbitration logic may optionally include additional queues for each processor, to hold requests as they arrive before they can be processed, and/or to hold results as they are returned from the single-port memory device.

Figure 1:
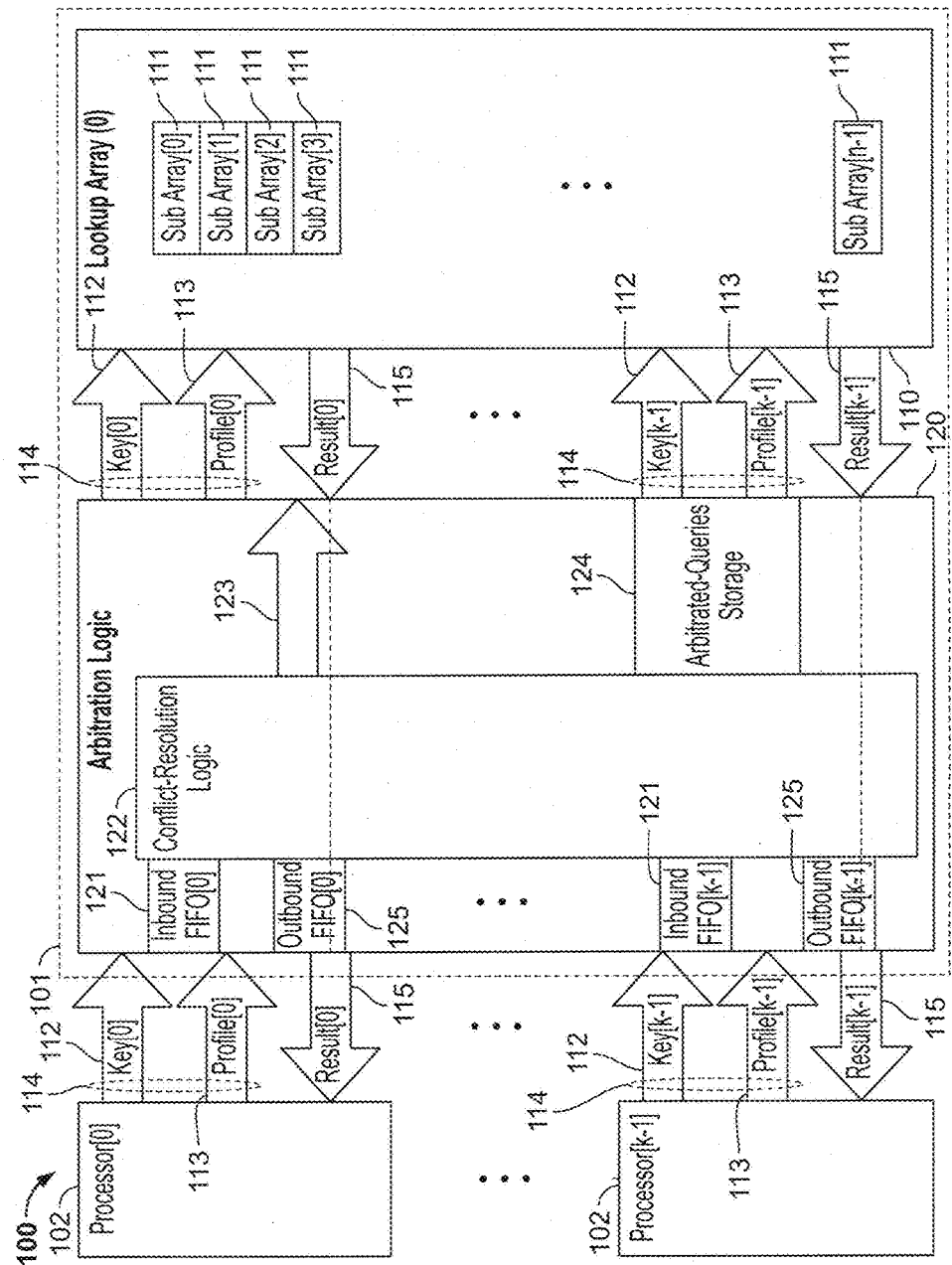
FIG. 1 shows a system including multi-port memory in accordance with an implementation of the subject matter of this disclosure.

From the outside, to the processors, the combination of the single-port memory device and the arbitration logic appears as a multi-port memory device. An example of such a combination, functioning as a multi-port memory device 101, is shown in FIG. 1, in a system 100 in which multi-port memory device 101 communicates with k processors (e.g., CPUs or NPUs) 102 (labelled 0, . . . , k−1). In a common case, multi-port memory device 101 will be a dual-port memory (k=2), but higher values of k are possible.

Multi-port memory device 101 includes single-port memory device 110 and arbitration logic 120. Single-port memory device 110 is able to service multiple queries in a single clock cycle but, in a typical case, cannot service more than one query that seeks to address the same data. Therefore, arbitration logic 120 is provided to determine whether more than one of multiple queries for multi-port memory device 101 received at any one time seek to access identical data in single-port memory device 110.

Queries arrive from each processor 102, and each query is placed in respective inbound FIFO 121 (labelled 0, . . . , k−1), where it is held until it can be processed by conflict-resolution logic 122 which determines whether there are any conflicts between queries—i.e., whether any two or more queries are seeking the same data from single-port memory device 110. Queries that do not conflict are passed on by conflict-resolution logic 122 to single-port memory device 110 via channel 123, and all of those queries may be processed within the same clock cycle. Queries that do conflict are loaded by conflict-resolution logic 122 into arbitrated-queries storage 124, where they are held until conflicts are resolved and then are passed on to single-port memory device 110.

As noted above, arbitrated-queries storage 124 can be a FIFO storage that can release queries whose conflicts have been resolved only in the order in which the queries have been loaded into arbitrated-queries storage 124. Therefore, if arbitrated-queries storage 124 is a FIFO, then if the oldest query in arbitrated-queries storage 124 has an unresolved conflict, then that oldest query will continue to be held in arbitrated-queries storage 124 and any newer queries also will be held, even if the conflicts that caused the newer queries to be loaded into arbitrated-queries storage 124 have been resolved, until the oldest query can be released. In an alternative implementation, arbitrated-queries storage 124 can be a different type of storage, such as a random-access memory, from which each queued-up query can be released as its associated conflict clears, regardless of the status of any other query in the queue.

Single-port memory device 110 processes the queries and returns the results 115 to the respective processors 102. Conflict-resolution logic 122 ordinarily plays no role in the return of query results 115 to processors 102. However, there may be a respective optional outbound FIFO 125 (labelled 0, . . . , k−1) corresponding to each processor 102, which can hold query results 115 in the event that multiple query results 115 are returned by single-port memory device 110 for a particular individual processor 102 faster than that particular individual processor 102 can accept the results 115.

As noted above, conflict-resolution logic 122 determines whether there are queries that cannot be processed in the same clock cycle because they seek to access the same data or, more strictly speaking, the same memory locations in single-port memory device 110. There may be several ways that conflict-resolution logic 122 makes that determination. For example, in the case of address-based queries (e.g., in ordinary SRAM or DRAM), conflict-resolution logic 122 may compare addresses in the different queries to see if any of the addresses overlap.

In the implementation shown in FIG. 1, the memory array of single-port memory device 110 is partitioned into n sub-arrays 111 (labelled 0, . . . , n−1), and conflict-resolution logic 122 compares the sub-arrays targeted by different queries to see if more than one query targets a particular sub-array. This may particularly be the case in content-addressable memories (CAM), whether binary CAM or ternary CAM. In a CAM, the query is not addressed to a particular address but rather is a search for particular content. The search normally is narrowed down by sub-array, where the available sub-arrays are made known to the processors 102 during initialization of system 100.

In such an implementation, each query may include a key, which sets forth the search criteria, and a profile, which indicates which sub-array or sub-arrays 111 should be targeted in the search. As shown in FIG. 1, each respective one of k processors 102 (labelled 0, . . . , k−1) sends a request in the form of a paired key 112 (labelled 0, . . . , k−1) and profile 113 (labelled 0, . . . , k−1) to multi-port memory device 101. As noted above, each request may be loaded first into a respective inbound FIFO 121 (labelled 0, . . . , k–1) before being processed in conflict-resolution logic 122, if the requests are issued by the processors 102 faster than they can be processed by conflict-resolution logic 122. After processing by conflict-resolution logic 122, each key/profile pair 114 is propagated to single-port memory device 110, whether directly through channel 123, or after being held in arbitrated-queries storage 124.

Figure 2:
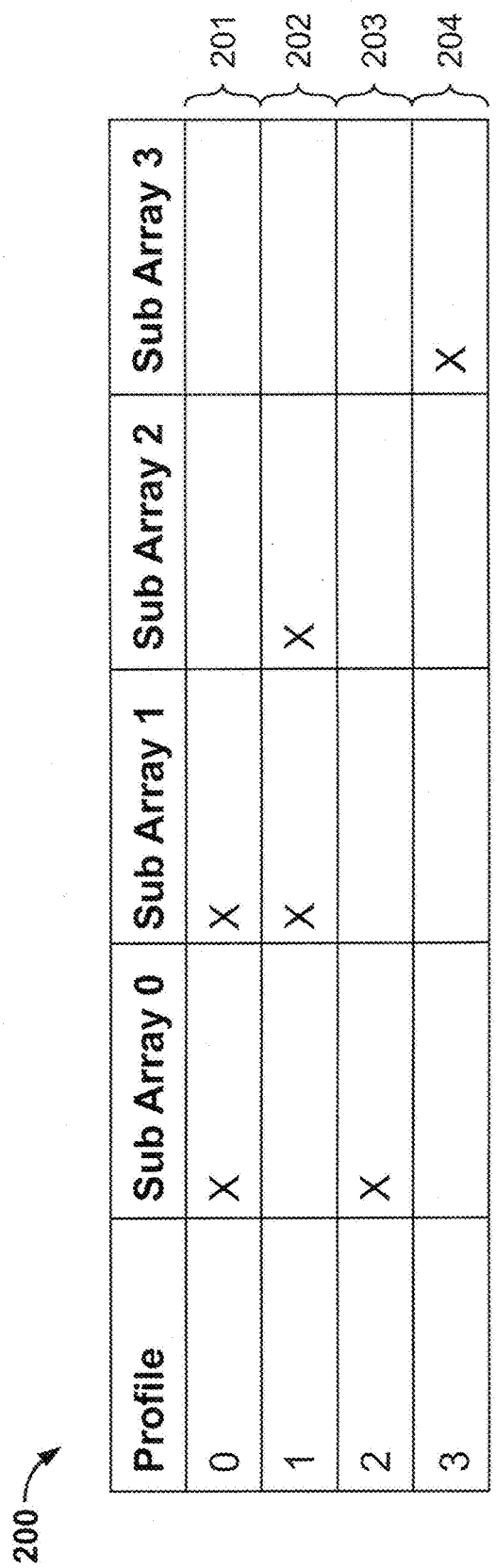
FIG. 2 shows an example of a table of memory profile conflicts.

In an implementation in which the memory array of single-port memory device 110 is partitioned into sub-arrays as shown in FIG. 1, and a query includes a profile 113, profile 113 will indicate which of sub-arrays 111 should be targeted in a search. FIG. 2 shows a simple example in which single-port memory device 110 is partitioned into four sub-arrays 111 (labelled 0, . . . , 3), and there are four profiles (also labelled 0, . . . , 3). The first profile 201 includes the first and second sub-arrays, the second profile 202 includes the second and third sub-arrays, the third profile 203 includes only the first sub-array, and the fourth profile 204 includes only the fourth sub-array.

One condition that conflict-resolution logic 122 will look for is more than one search targeted to the same profile, which cannot be performed in the same clock cycle. Conflict-resolution logic 122 will also look for searches targeted to overlapping profiles, meaning profiles having at least one sub-array in common, which also cannot be performed in the same clock cycle. In the example of FIG. 2, profile conflict table 200 (there may be more than one such table) shows that profile 201 overlaps profile 203 because both include sub-array 0. Profile 201 also overlaps profile 202, because both include sub-array 1. However, profile 204 is the only profile that includes sub-array 3 and therefore profile 204 does not overlap any other profile. Similarly, profile 202 and profile 203 do not overlap.

If every search were to overlap with every other search, then multi-port memory device 101 would operate in the same way as known memories in the time-division mode. However, in practice, as long as a sufficient number of non-overlapping sub-arrays is provided, the number of collisions can be reduced substantially. For example, in a dual-port memory arrangement communicating with two processors 102, and having 32 non-overlapping sub-arrays, the probability of a collision can be shown to be less than 5%, providing a 95% bandwidth improvement compared to a pure time-division approach, without increasing total memory capacity. The worst-case scenario (compete overlap of queries so that every query has to be held for a different clock cycle) would be identical to the time-division approach.

Figure 3:
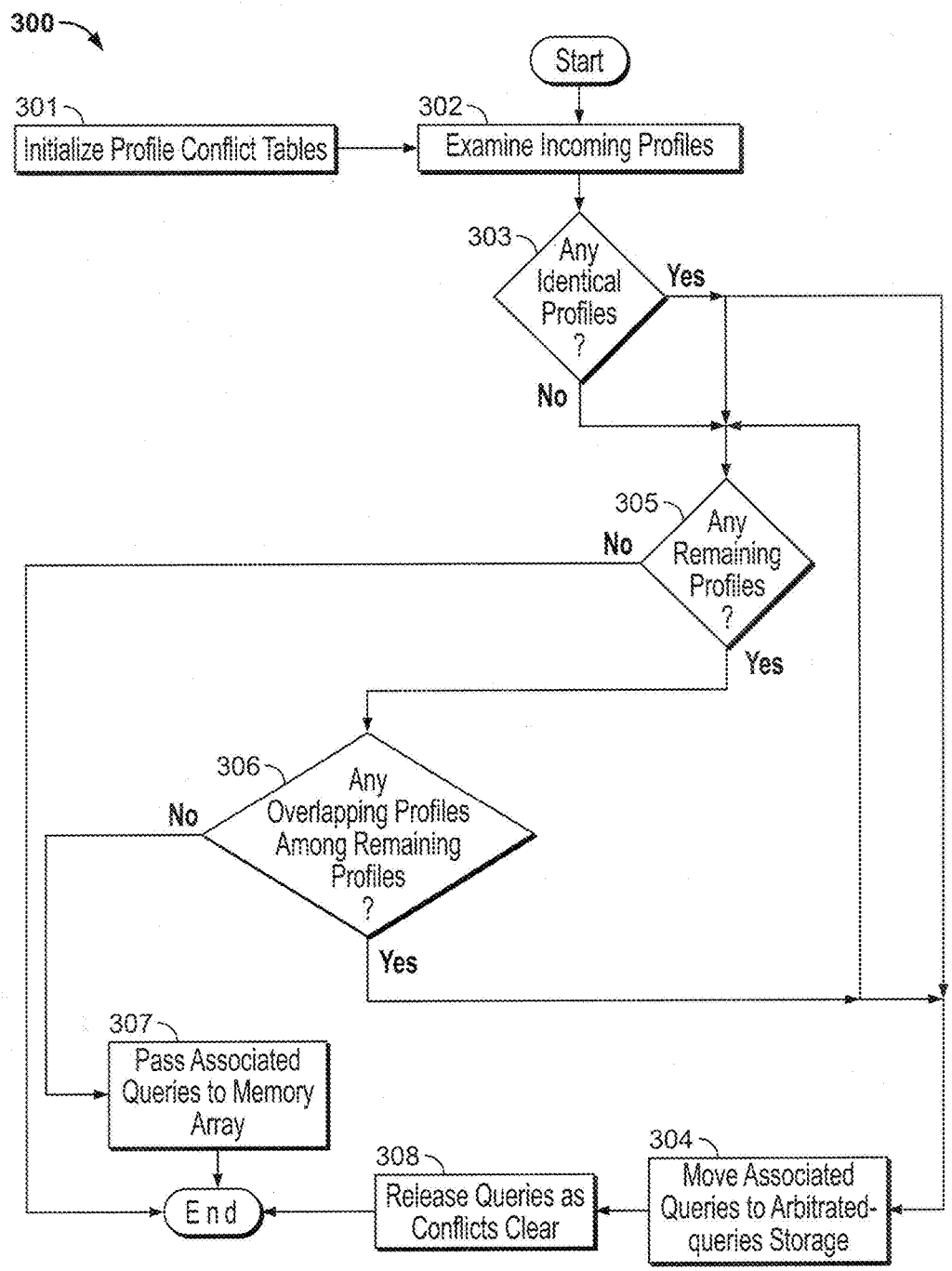
FIG. 3 is a flow diagram illustrating a method of operation of arbitration logic in accordance with an implementation of the subject matter of this disclosure.

One example 300 of the operation of conflict-resolution logic 122 is shown in FIG. 3. Prior to operation, at 301, profile conflict tables are initialized. Thus, using the example of FIG. 2, profile 0 would conflict with profile 1 and profile 2, profile 1 would conflict only with profile 0, profile 2 would conflict only with profile 0, and there would be no conflicts involving profile 3.

At 302, the incoming profiles would be examined and at 303 it would be determined whether there are any queries that address identical profiles. If so, then at 304, those queries would be moved to arbitrated-queries storage 124. If at 303 it is determined that there are no queries that address identical profiles, or after it has been determined at 303 that there are queries that address identical profiles (and in parallel with the moving of those queries), it would be determined at 305 whether there are any remaining queries (queries that did not address identical profiles).

If at 305 there are no remaining queries, process 300 ends. If at 305 there are remaining queries, then at 306 it would be determined whether there are queries among the remaining queries that address overlapping profiles. If at 306 it is determined that there are no queries among the remaining queries that address overlapping profiles, then at 307 all remaining queries are passed to the memory array in single-port memory device 110.

If at 306 it is determined that there are queries among the remaining queries that address overlapping profiles, then at 304 those queries that address overlapping profiles would be moved to arbitrated-queries storage 124, and in parallel with moving those queries to arbitrated-queries storage 124, process 300 would return to 305 to determine whether there are any remaining queries, and would proceed from there.

At 308, all queries that had been moved at 304 to arbitrated-queries storage 124 will be released to the memory array in single-port memory device 110 as their associated conflicts clear (subject to the considerations discussed above as to whether arbitrated-queries storage 124 is a FIFO or a form of random-access memory). This may occur continually in parallel with other portions of process 300.

Thus it seen that that a multi-port memory, configured from a single-port memory device and arbitration logic, as well as a method of operation of such a memory, have been provided.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. Multi-port memory circuitry, comprising:
   single-port memory circuitry; and
   arbitration logic circuitry that accepts multiple memory queries for the single-port memory circuitry and prevents the multiple memory queries from addressing conflicting portions of the single-port memory circuitry within a single clock cycle.

2. The multi-port memory circuitry of claim 1, wherein the arbitration logic circuitry includes storage for holding ones of the multiple memory queries that address conflicting portions of the single-port memory circuitry.

3. The multi-port memory circuitry of claim 2, wherein the storage for holding ones of the multiple memory queries is a FIFO storage.

4. The multi-port memory circuitry of claim 2, wherein the storage for holding ones of the multiple memory queries is a random-access storage.

5. The multi-port memory circuitry of claim 1, wherein the arbitration logic circuitry includes conflict-resolution logic circuitry that determines whether multiple memory queries address conflicting portions of the single-port memory circuitry.

6. The multi-port memory circuitry of claim 5, further comprising input memories for holding incoming memory queries prior to processing by the conflict-resolution logic circuitry.

7. The multi-port memory circuitry of claim 5, wherein:
   the single-port memory circuitry is divided into a plurality of sub-arrays; and
   the conflict-resolution logic circuitry determines whether the multiple memory queries address overlapping groups of sub-arrays.

8. The multi-port memory circuitry of claim 1, wherein the single-port memory circuitry is a content-addressable memory.

9. The multi-port memory circuitry of claim 1, wherein the single-port memory circuitry is a random-access memory.

10. A shared-memory, multi-processor apparatus, the apparatus comprising:
    a plurality of processors; and
    multi-port memory circuitry, the multi-port memory circuitry including:
    single-port memory circuitry, and
    arbitration logic circuitry that accepts multiple memory queries for the single-port memory circuitry from the plurality of processors and prevents the multiple memory queries from addressing conflicting portions of the single-port memory circuitry within a single clock cycle.

11. The shared-memory, multi-processor apparatus of claim 10, wherein the arbitration logic circuitry includes storage for holding ones of the multiple memory queries that address conflicting portions of the single-port memory circuitry.

12. The shared-memory, multi-processor apparatus of claim 11, wherein the storage for holding ones of the multiple memory queries is a FIFO storage.

13. The shared-memory, multi-processor apparatus of claim 11, wherein the storage for holding ones of the multiple memory queries is a random-access storage.

14. The shared-memory, multi-processor apparatus of claim 10, wherein the arbitration logic circuitry includes conflict-resolution logic circuitry that determines whether multiple memory queries address conflicting portions of the single-port memory circuitry.

15. The shared-memory, multi-processor apparatus of claim 14, wherein the multi-port memory circuitry further comprises a respective input memory for holding incoming memory queries from each respective one of the plurality of processors prior to processing by the conflict-resolution logic circuitry.

16. The shared-memory, multi-processor apparatus of claim 14, wherein:
    the single-port memory circuitry is divided into a plurality of sub-arrays; and
    the conflict-resolution logic circuitry determines whether the multiple memory queries address overlapping groups of sub-arrays.

17. The shared-memory, multi-processor apparatus of claim 10, wherein the single-port memory circuitry is a content-addressable memory.

18. The shared-memory, multi-processor apparatus of claim 10, wherein the single-port memory circuitry is a random-access memory.

19. A method of operating arbitration logic circuitry to prevent the multiple memory queries from addressing conflicting portions of single-port memory circuitry within a single clock cycle, the method comprising:
    determining whether any of the multiple memory queries address conflicting portions of the single-port memory circuitry; and
    holding ones of the multiple memory queries that address conflicting portions of the single-port memory circuitry for at least one clock cycle until conflicts clear.

20. The method of claim 19 wherein:
    each respective one of the multiple memory queries includes a respective profile identifying at least one portion of the single-port memory circuitry targeted by the respective one of the multiple memory queries; and
    the determining whether any of the multiple memory queries address conflicting portions of the single-port memory circuitry comprises examining each respective profile.

21. The method of claim 20 further comprising initializing a table of profiles to indicate conflicts among profiles.

* * * * *